United States Patent
Sautto et al.

(10) Patent No.: US 12,255,595 B2
(45) Date of Patent: Mar. 18, 2025

(54) CALIBRATION METHOD, CORRESPONDING CIRCUIT AND APPARATUS

(71) Applicants: STMicroelectronics S.r.l., Agrate Brianza (IT); STMicroelectronics Asia Pacific Pte Ltd., Singapore (SG)

(72) Inventors: Marco Sautto, Zurich (CH); Giona Fucili, Milan (IT); Valerio Lo Muzzo, Singapore (SG); Kaufik Linggajaya, Singapore (SG)

(73) Assignees: STMicroelectronics Asia Pacific Pte Ltd., Singapore (SG); STMicroelectronics S.r.l., Agrate Brianza (IT)

( * ) Notice: Subject to any disclaimer, the term of this patent is extended or adjusted under 35 U.S.C. 154(b) by 872 days.

(21) Appl. No.: 17/371,368

(22) Filed: Jul. 9, 2021

(65) Prior Publication Data
US 2022/0021373 A1    Jan. 20, 2022

(30) Foreign Application Priority Data
Jul. 15, 2020 (IT) .................. 102020000017200

(51) Int. Cl.
*H01L 41/02* (2006.01)
*H03H 11/04* (2006.01)
*H10N 30/30* (2023.01)

(52) U.S. Cl.
CPC ......... *H03H 11/0422* (2013.01); *H10N 30/30* (2023.02); *H03H 2011/0488* (2013.01)

(58) Field of Classification Search
CPC .................................................. H10N 30/30
(Continued)

(56) References Cited

U.S. PATENT DOCUMENTS 8,132,459 B2    5/2012    Toga et al.
8,283,836 B2 *   10/2012    Kamitani ............... F04D 27/00
                                                           310/317

(Continued)

OTHER PUBLICATIONS

Seagate Blog, "Cloud-Native: Resilient Edge Cloud Storage Open for Business", Seagate Blog, https//blog.seagate.com, copyright 2021, downloaded Jul. 15, 2021, 4 pages.

(Continued)

*Primary Examiner* — Derek J Rosenau
(74) *Attorney, Agent, or Firm* — Slater Matsil, LLP

(57) ABSTRACT

In accordance with an embodiment, a method of operating a piezoelectric transducer configured to transduce mechanical vibrations into transduced electrical signals at a pair of sensor electrodes includes stimulating a resonant oscillation of the piezoelectric transducer by applying at least one pulse electrical stimulation signal to the pair of sensor electrodes; detecting, at the pair of sensor electrodes, at least one electrical signal resulting from the stimulated resonant oscillation, wherein the at least one electrical signal resulting from the stimulated resonant oscillation oscillates at a resonance frequency of the piezoelectric transducer; measuring a frequency of oscillation of the at least one electrical signal resulting from the stimulated resonant oscillation to obtain a measured resonance frequency of the piezoelectric transducer; and tuning a stopband frequency of a notch filter coupled to the piezoelectric transducer to match the measured resonance frequency of the piezoelectric transducer.

20 Claims, 8 Drawing Sheets

(58) Field of Classification Search
USPC .................................................. 310/317, 318
See application file for complete search history.

(56) References Cited

U.S. PATENT DOCUMENTS

| | | | |
|---|---|---|---|
| 8,508,104 B2* | 8/2013 | Kamitani | ................ F04D 33/00 |
| | | | 310/317 |
| 8,737,012 B2 | 5/2014 | Otani | |
| 8,804,265 B2 | 8/2014 | Otaguro et al. | |
| 9,564,162 B1 | 2/2017 | Byoun et al. | |
| 9,620,160 B1 | 4/2017 | Byoun et al. | |
| 9,709,533 B2 | 7/2017 | Nizza et al. | |
| 2007/0226771 A1 | 9/2007 | Nagahori | |
| 2007/0241711 A1 | 10/2007 | Finamore et al. | |
| 2014/0063652 A1 | 3/2014 | Otani | |

OTHER PUBLICATIONS

Wikpedia, "Dichotomic search", in Wikipedia® at wikipedia.org, https://en.wikipedia.org/wiki/Dichotomic_search, May 31, 2021, 2 pages.

* cited by examiner ns the benefit of Italian Patent Application No. 102020000017200, filed on Jul. 15, 2020, which application is hereby incorporated herein by reference in its entirety.

TECHNICAL FIELD

The description relates to calibration methods and systems, such as tuning, for instance. One or more embodiments may be applied to piezoelectric transducers in hard disk drivers (HDDs), for instance.

BACKGROUND

Demand for data storage is growing thanks to cloud-based services (such as artificial intelligence, machine learning, internet-of-things, for instance). As a result, data centers benefit from the capability of using high-density HDDs. At the same time, such HDDs may be arranged in racks where vibrations come into play (such as those due to cooling fans, cheap chassis, multi-spindle environments, for instance). Such vibrations may affect and cause failures in HDD operation particularly in the case of read/write (R/W) HDD heads configured to catch tracks down to 20 nm (1 nm=10-6 m=1 nanometer). In order to cope with such vibration errors, rotational-vibration feed-forward (RVFF) compensation has been developed in order to keep a read-write head on track also in the presence of external perturbations. Thus, vibration rejection represents a desired feature in order to meet the demand for high-performance drives.

Due to an increasing miniaturization of tracks and disk spinning speeds, which can reach 15000 RPM, accurately sensing and compensating vibrations in the acoustic frequency range (sub-1 kHz, for instance) may become relevant. Mechanical-to-electric transducers, such as piezoelectric transducers, for instance, may be used in such context in order to detect shocks or vibrations applied to an HDD. The parameters read from such a sensor are used by the HDD controller as a feedforward parameter in order to better control the position of the R/W head on the magnetic disk and to prevent any possible damage. Such sensors present the advantage of being low-cost. On the other hand, they present the drawback of self-resonant oscillation, which may involve a complex detection and filtering. For instance, such a sensor may present a strong resonant peak in the range 20-50 kHz and about 30 dB higher than a signal caused by a rotational-vibration (RV).

In conventional sensor manufacturing, the resonance frequency can be far, up to 20% from the nominal value, which may be inadequate for various HDD applications. Reaching tolerance values within 1% may involve complex calibration routines.

Conventional methods to detect resonance frequency involve applying an electric pulse to the sensor and measuring its oscillation frequency by using one of threshold crossing detection, a phase-lag technique or an ADC. A further conventional solution involves inserting the sensor in an oscillator circuit.

These issues are discussed in the technical literature, including patent documents.

For instance, U.S. Pat. No. 9,709,533 B2 discloses a method of determining a resonance frequency of a resonant device including stimulating the resonant device with a periodic input signal having a frequency in a frequency interval; determining a frequency value for the periodic input signal in the frequency interval for which a phase-difference between the periodic input signal and a corresponding periodic output signal of the resonant device is minimum; generating a flag indicating that a resonance frequency has been determined; and generating signals representing the resonance frequency as a value of the frequency of the periodic input signal.

Document U.S. Pat. No. 8,132,459 B2 discloses systems and methods for determining mechanical resonance of a sensor, where a system is provided that comprises a bias voltage source configured to apply a bias voltage impulse signal to a terminal of the sensor and a zero crossing detector configured to detect zero crossing cycles of a sensor output signal response to the bias voltage impulse signal, and wherein the system further comprises a controller configured to determine the resonance frequency of the sensor based on the detected zero crossing cycles of the sensor output signal response; during the test mode, the programmable filter is bypassed.

Document U.S. Pat. No. 8,737,012 B2 discloses an apparatus for use with a hard disk drive, comprising: a selectable notch filter with a selectable notch frequency; a shock sensor of the hard disk drive, coupled to the selectable notch filter, the shock sensor having at least one resonance frequency; a flip flop coupled to an output of the notch filter and an output of the shock sensor; a calibration logic coupled to an output of the flip flop, wherein an output of the calibration logic is coupled to a selection input of the selectable notch filter.

Document U.S. Pat. No. 9,564,162 B1 discloses a data storage device comprising a disk, a head, and a shock sensor comprising a first terminal and a second terminal, where a first bias signal is applied signal to the first terminal of the shock sensor and a second bias signal is applied to the second terminal of the shock sensor and an oscillating signal is generated by increasing the first bias signal and decreasing the second bias signal, and a resonant frequency of the shock sensor is detected based on the oscillating signal; a physical shock affecting the head actuated over the disk is detected based on a response of the shock sensor to the physical shock and based on the detected resonant frequency of the shock sensor.

Document U.S. Pat. No. 9,620,160 B1 discloses a data storage device comprising a disk, a head, a shock sensor, and an oscillator circuit responsive to the shock sensor and configured to generate an oscillating signal using positive feedback; a resonant frequency of the shock sensor is detected based on the oscillating signal and a physical shock affecting the head actuated over the disk is detected based on a response of the shock sensor to the physical shock and based on the detected resonant frequency of the shock sensor.

Document U.S. Pat. No. 8,804,265 B2 discloses a method of calibrating a frequency filter which includes: applying a series of input electrical signals at different frequencies to a shock sensor, using circuitry to identify a particular one of the frequencies as a resonance frequency of the shock sensor based on responses of the shock sensor to the series of input signals, and setting a center frequency of the notch filter equal to the particular frequency identified as the resonance frequency of the shock sensor.

Existing solutions discussed in the foregoing may present one or more of the following drawbacks: difficulty in decorrelating the measurement from the impedance of a piezoelectric sensor, as well as from the (input) impedance of the signal processing chain (e.g., comprising an amplifier stage);

use of time-consuming frequency sweeps; difficulty in providing and controlling adequately the amplitude of the oscillation of the sensor; disturbances, e.g. at low frequencies, which may be hard to filter out, leading to errors; limitations in the detection of the output phase near the notch frequency, insofar as the notch output may be almost zero by construction (attenuation $>_{70}$ dB); increased area consumption, for instance due to the presence of an analog-to-digital converter, input signal generator or resistors and capacitors; and inaccuracy, for instance due to a disconnection of an amplifier on which measurement may depend, during the measurement stage, or otherwise due to non-idealities coming into play only during normal RV/shock signal elaboration.

SUMMARY

One or more embodiments may relate to a corresponding circuit. An application-specific integrated-circuit (ASIC) may be exemplary of such a circuit.

One or more embodiments may relate to a corresponding apparatus. A test assembly of a piezoelectric sensor and the ASIC circuit may be exemplary of such an apparatus.

One or more embodiments may facilitate detecting, with improved accuracy and reliability, the resonant frequency of a piezoelectric sensor.

One or more embodiments may envisage measuring, for instance via a digital counter, the frequency of the sensor during free-oscillation thereof, and tuning of the notch filter as a function of such a measurement.

One or more embodiments may benefit in terms of accuracy from a circuit architecture where a same signal path is shared between shock signal conditioning and frequency detection. For instance, this may be due to the presence of the same non-idealities are shared across the same during the entire method processing.

BRIEF DESCRIPTION OF THE DRAWINGS

One or more embodiments will now be described, by way of non-limiting example only, with reference to the annexed Figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments. The headings/references used herein are provided merely for convenience and hence do not define the extent of protection or the scope of the embodiments. The drawings are in simplified form and are not to precise scale.

Throughout the figures annexed herein, like parts or elements are indicated with like references/numerals and a corresponding description will not be repeated for each and every figure for brevity.

Figure 1:
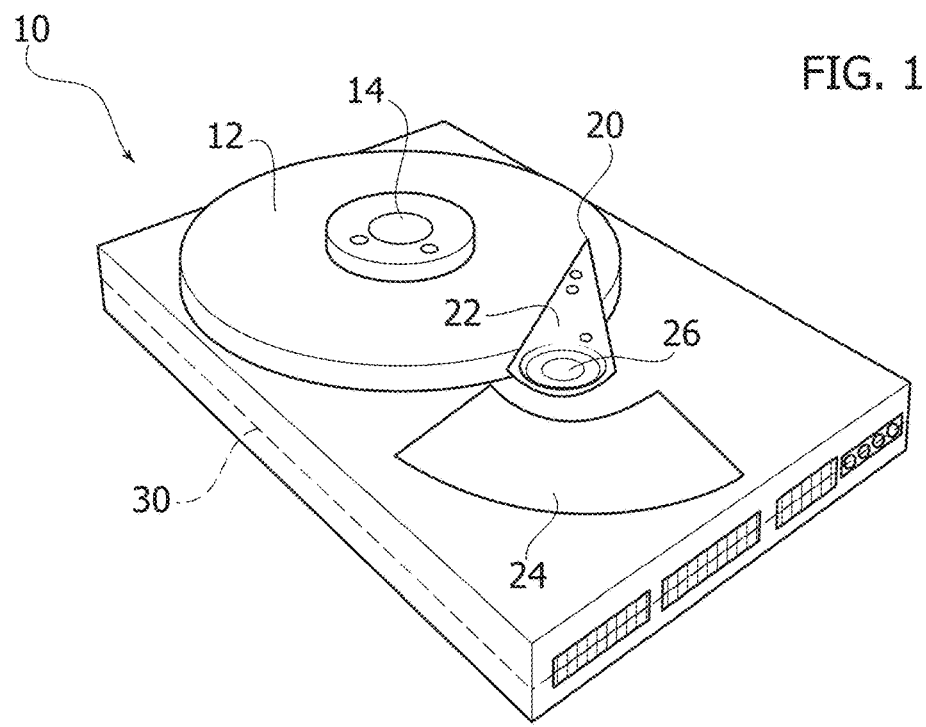
FIG. 1 is illustrative of an exemplary hard disk drive, HDD.

FIG. 1 is a diagram of an HDD device 10 that is an electro-mechanical data storage device that uses magnetic storage to store and retrieve digital data.

As exemplified in FIG. 1, such an HDD 10 may comprise: one or more rigid platters 12 coated with magnetic material and coupled to a spindle 14 configured to cause the platters 12 to rotate rapidly about an axis perpendicular to the surface of the platters 12; one or more magnetic read/write (R/W) heads 20 each paired with a respective rigid platter 12 configured to read and write data to the platter surfaces 12; an actuator 24 having an actuator arm 22 coupled to the magnetic R/W head 20 and configured to move the actuator arm 22 around an actuator axis 26; and a printed-circuit-board (PCB) 30 comprising electronic circuitry configured to control the movement of the actuator and the rotation of the disk to perform reads and writes.

Figure 2:
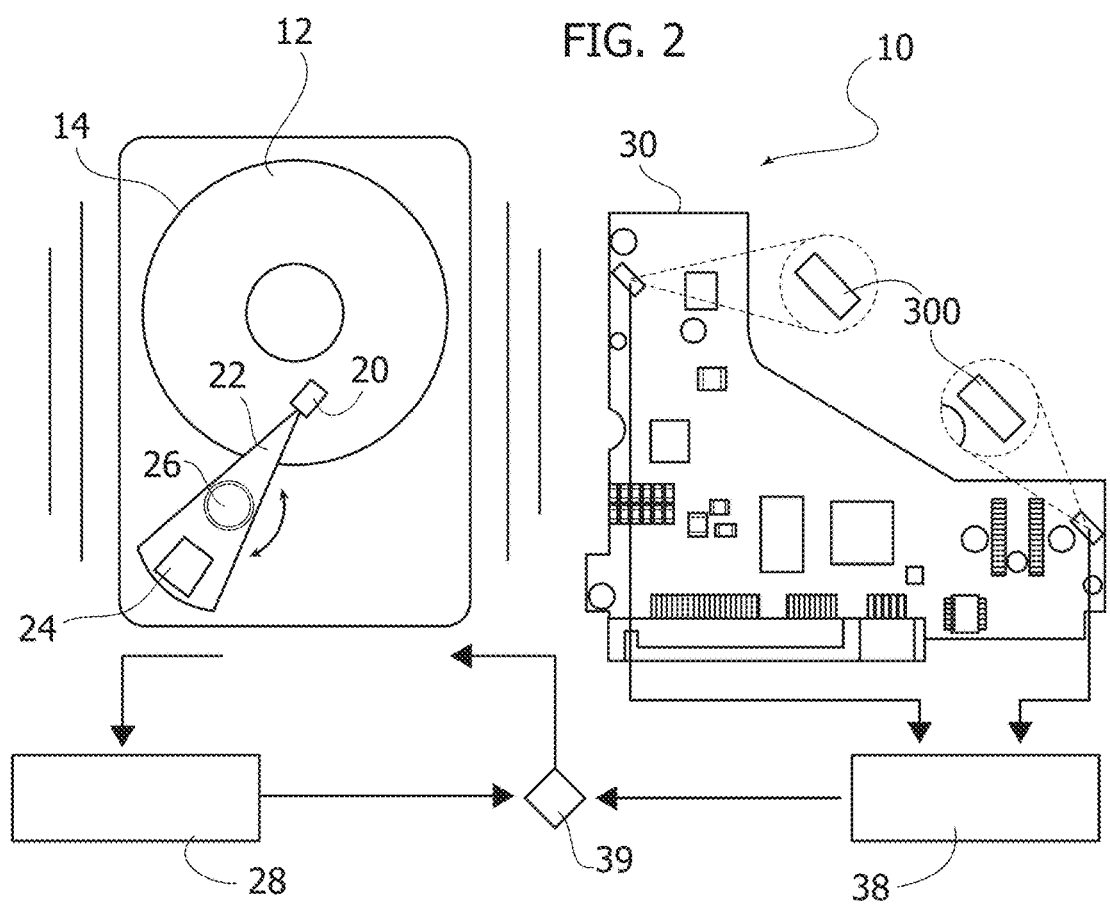
FIG. 2 is a diagram exemplary of a method of treating rotational vibration, RV.

As exemplified in FIG. 2, electronic circuitry on the PCB board 30 may be coupled to the electro-mechanical actuator 24 and may be configured to control as a function of data received or sensed from the HDD 10.

For instance, the control circuitry may comprise:

a (e.g., standard) feedback controller stage 28 coupled to the actuator assembly 20, 22, 24, 26 configured to receive feedback from a position error signal of the HDD R/W head 20;

a set of piezoelectric transducers 300 configured to detect rotational vibrations during HDD operation, producing an electrical signal indicative of such vibrations as a result; a processing stage 38, e.g. an acceleration feed-forward controller, coupled to the piezoelectric sensors 300 and configured to receive the electrical signal produced by the sensors 300; and a system control circuit 39 configured to provide feedback to the actuator assembly 20, 22, 24, 26 in order to treat, for instance compensating, vibrations detected by the piezoelectric sensors 300 during displacement of the R/W head 20 with respect to the surfaces of the platters 14.

In general terms (and with the exception of what will be discussed in detail in the following) the structure and operation of an HDD 10 as discussed herein are conventional in the art, which makes it unnecessary to provide a more detailed description herein.

Figure 3:
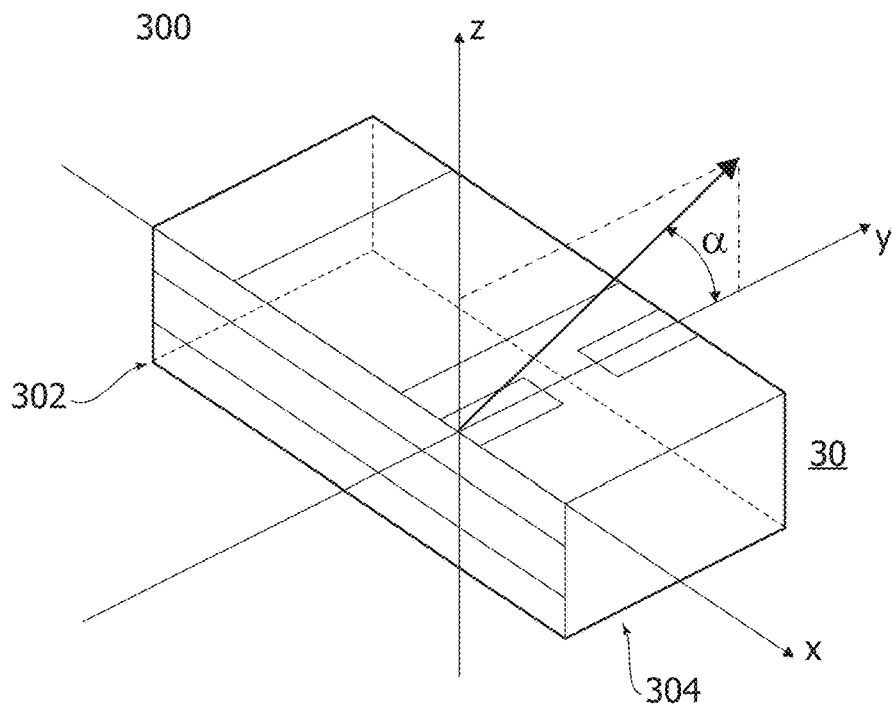
FIG. 3 is an enlarged perspective view of a piezoelectric transducer.

FIG. 3 is an enlarged perspective view of a piezoelectric transducer 300 to which one or more embodiments may apply.

As mentioned, such a piezoelectric transducer 300 may be configured to detect mechanical acceleration and shock applied from outside of the HDD, producing an electrical signal indicative of such a mechanical shock as a result. For instance, the piezoelectric transducer 300 may detect acceleration along a direction (which may correspond to a primary axis of the sensor 300) forming an angle α with the platters 12.

Figure 4:
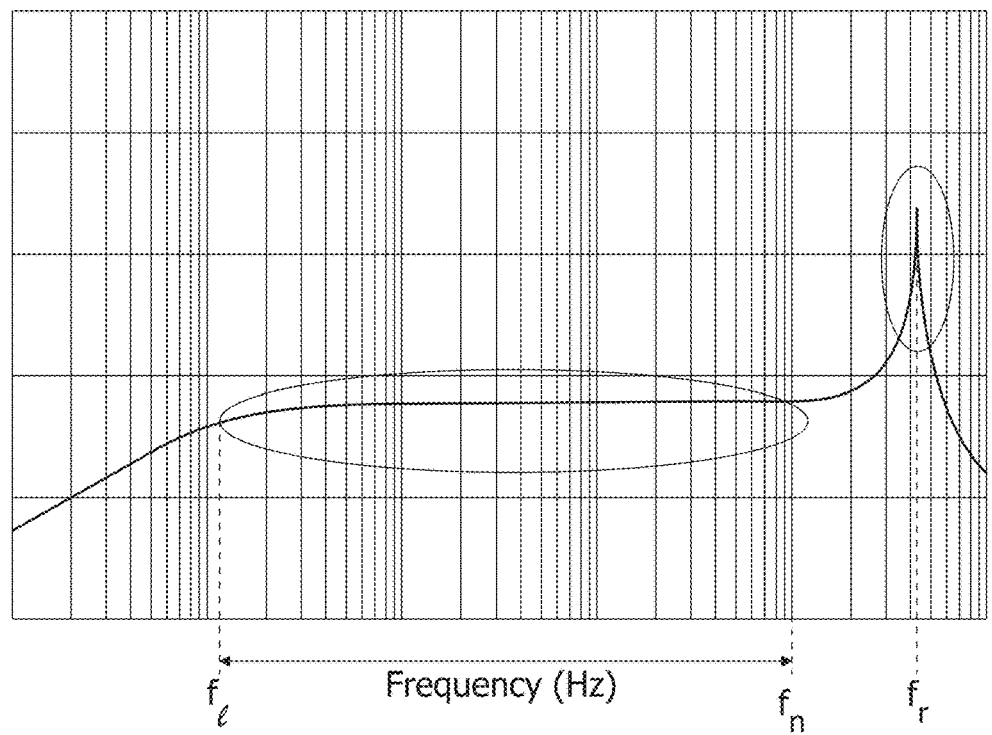
FIG. 4 is a plot of a frequency response of a piezoelectric transducer.

As exemplified in FIG. 4, the piezoelectric transducer 300 may have a certain frequency response which may vary as a function of the range of frequencies in which it is excited.

As exemplified in FIG. 4, the frequency response may be substantially flat in a frequency range between a low frequency $f_l$ and a high frequency $f_h$, and it may as well present a resonant peak (such as that of a longitudinal resonant mode, for instance) at a resonance frequency $f_r$.

While applications may exploit signals at low frequencies, that fall between $f_l$ and $f_h$, the presence of the resonance peak leads the piezoelectric transducer 200 to produce signals having a strong, undesired signal component at the frequency $f_r$, representing a disturbance for the system. It may be of interest to remove the signal component at frequency $f_r$, facilitating to relax the performance of the circuits that has to elaborate this signal.

As exemplified herein, this may be via use of a narrow band-stop or "notch" filter, for brevity, circuit tuned at the resonant frequency $f_r$ and thus configured to suppress the resonance. This may involve preliminary excitation of the piezoelectric transducer 300 to produce a periodic signal at its resonance frequency $f_r$. Subsequently, the notch filter may be made to oscillate producing a periodic signal at its notch frequency. As a result, the periodic signal resulting from the excitation and the periodic signal at the notch frequency may be compared to tune the notch filter to produce a periodic signal whose frequency matches that of the piezoelectric resonance frequency, as discussed in the following.

Figure 5:
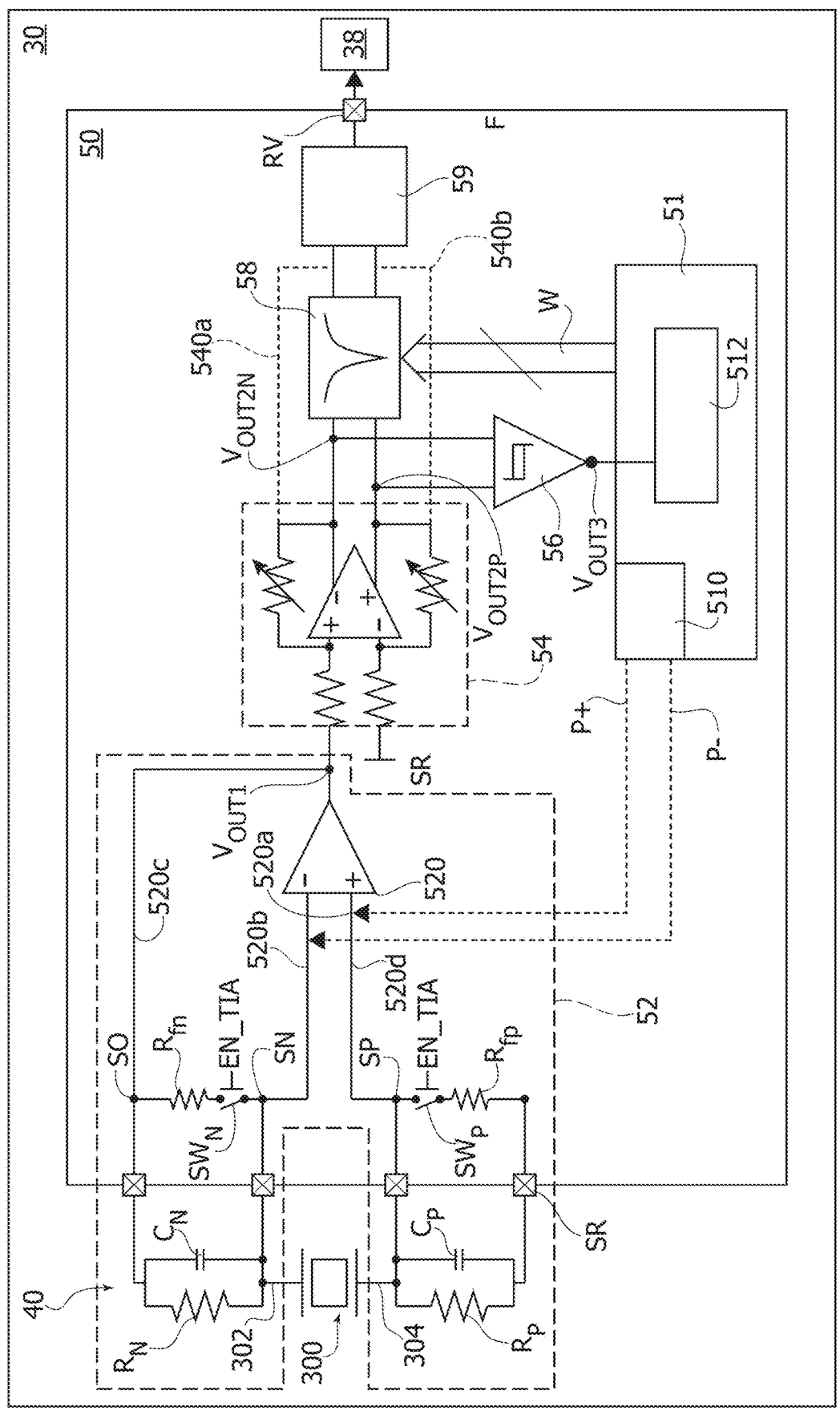
FIG. 5 is a diagram exemplary of a circuit according to one or more embodiments.

FIG. 5 is a diagram of an application-specific integrated circuit (ASIC) 50 configured to perform such a process.

As exemplified in FIG. 5, such an ASIC 50 may be configured to be coupled to a circuit 40 comprising the piezoelectric sensor 300 having a first input node 302 coupled to a first series RC circuit comprising a first resistor RN and a first capacitor CN, and a second input node 304 of the sensor 300 being coupled to a second series RC circuit comprising a second resistor Rp and a second capacitor Cp.

As exemplified in FIG. 5, the ASIC may be coupled the test circuit 40 for the sensor 300 via a plurality of input nodes SO, SN, SP, SR, comprising a first pair of input nodes SN, SP configured to be coupled to the electrodes 302, 304 of the piezoelectric transducer 300, and a second pair of input nodes SO, SR each configured to be coupled to series RC circuits Rn, Cn, Rp, Cp coupled at the electrodes of the sensor 300 respective test circuit 40 Rn, Cn, Rp, Cp for the sensor 300, a first input node SR configured to be at a reference voltage level.

As exemplified in FIG. 5, such an ASIC 50 may comprise: a control logic block 51, for instance a digital IP core, configured to generate 510 at least one pulse electrical signal, for instance one or more pulsed signals P+, P−, and to set 512 a frequency for a notch filter 58, as discussed in the following; and a first (charge) amplifier stage 52, such as an operational amplifier 520 having non-inverting 520a and inverting 520b input nodes and an output node, for instance.

The first amplifier stage 52 may have its input nodes 520a, 520b coupled to the control logic 51 and to the first pair of input nodes SN, SP, the nodes 520a, 520b being thus configured to receive the input signal P+, P− from the controller 51 and to apply it input nodes SN, SP. Notch filter 58 may be implemented using notch filter circuits known in the art. In some embodiments, notch filter 58 may be implemented using an active notch filter. Programmability of the stopband of notch filter 58 may be achieved using selectable components, such as selectable capacitors and/or selectable resistances.

The first amplifier stage 52 may further comprise, for instance: a feedback branch 520c coupling the output node to the input node SO of the ASIC 50 and to the inverting input node 520b of the amplifier 520 via a resistor $Rf_N$ and a first switch SN; and a further branch 520d selectively couplable, via a second switch $SW_p$ to the second input node SR via a second resistor $Rf_p$ between the second input node SP of the ASIC 50 and the second input node of the first amplifier 52.

In one or more embodiments, such switches $SW_n$, $SW_p$ may be controllable between an open and closed state as a function of a control signal EN_TIA which may be produced by the control logic block 51; closing the feedback branch 520c between input 520b and the output node of amplifier 520 may enable a fast settling time of the charge amplifier, which may be turned to a transimpedance amplifier configured to receive an input electric current signal to produce an output amplified voltage signal $V_{OUT1}$ at the output node.

During oscillation, the fast settling mode facilitates speeding up the settling time of the oscillation, and rejecting the low frequency noise where a large part of the random vibrations of the external environment sensed by piezoelectric sensor 300 are present, whereas such disturbances would otherwise affect measurement precision.

As exemplified in FIG. 5, the resistors $Rf_p$, $Rf_n$ are put in parallel to external resistors $R_n$, $R_p$ without changing the resonance frequency.

As exemplified in FIG. 5, the ASIC may further comprise: a second amplifier stage 54, such as a fully differential inverting amplifier, coupled to the output node OUT1 of the first amplifier stage 52 and to a second node SR at a reference voltage level, the second amplifier stage 54 being configured to apply amplification processing 520 to the voltage signal $V_{OUT1}$ output from the first amplifier stage 52, producing a pair of output voltage signals; a comparator stage 56, such as a comparator with hysteresis, for instance, having input nodes coupled to the second amplifier stage 54 and an output node coupled to the controller circuit 51, the comparator 56 configured to "square" the signal from the second amplifier stage 54 making it compatible with digital processing from the control circuit 51; and a tunable notch filter stage 58, such as a digitally programmable "notch" filter, for instance, having its output selectively couplable to the input of the second amplifier stage 54 via feed-back branches 540a, 540b; the notch filter 58 may also be coupled to the control circuit 51, wherein the tunable notch filter 58 has a stopband frequency value which may be programmable, for instance set via a control signal W from the control logic 51.

The notch filter stage 58 may be configured to apply very narrow band-stop filtering at the set notch frequency to the input signal $V_{OUT2N}$, $V_{OUT2P}$ received from the second amplifier stage 54.

The ASIC 50 may further comprise a third amplifier stage 59 coupled to the notch filter stage 58 and configured to apply amplification processing to the filtered signal, which may be provided at the output node RV of the ASIC to further user circuits, for instance to the processing stage 38 on the board 30 of the HDD 10.

A method 60 suitable for operating the ASIC 50 as exemplified in FIG. 5 may include: a first stage 62 comprising exciting the resonant frequency $f_r$ of the piezoelectric sensor 300, and a second stage 64 comprising (auto-)tuning the notch filter 58, iteratively (re-)setting the notch filter frequency to match with the resonant frequency $f_r$ of the sensor 300.

Figure 6:
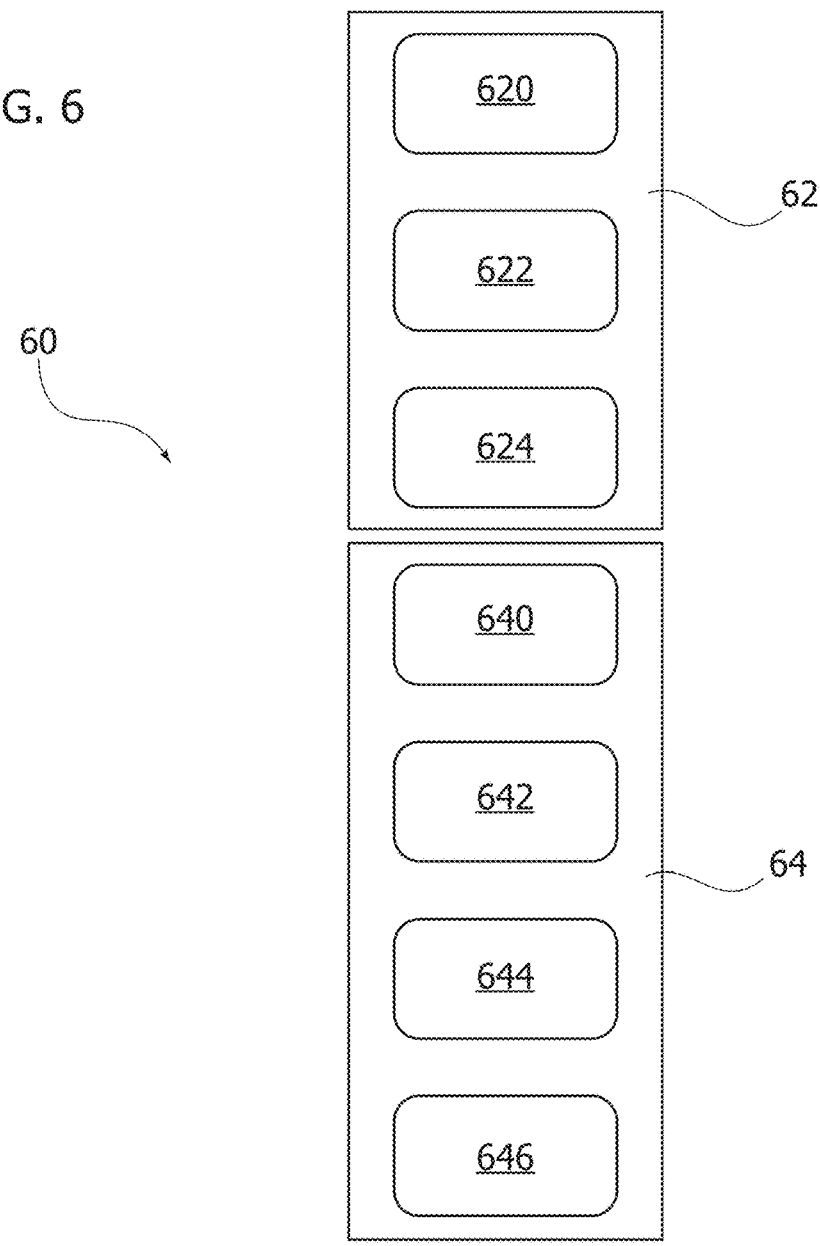
FIG. 6 is a diagram exemplary of a method according to one or more embodiments.
Figure 6A:
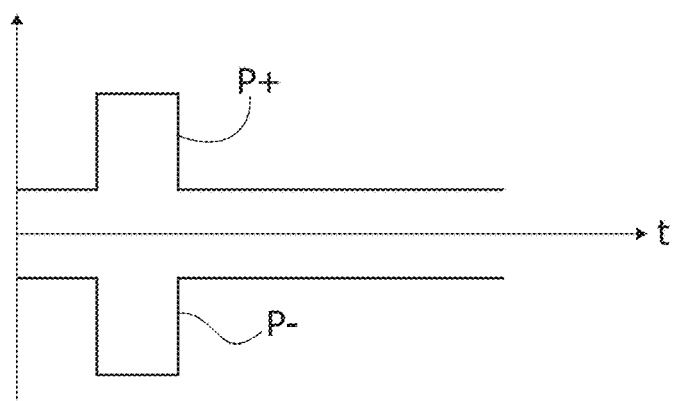
FIGS. 6A to 6G comprise time diagrams exemplary of signals which may occur in embodiments as per the present disclosure.

As exemplified in FIG. 6, the first stage 62 of the method 60 may include stimulating (see block 620) a resonance of the piezoelectric sensor 300, hence obtaining a (resonant) oscillation of the piezoelectric sensor 300; this may be via an electrical signal P+, P− such as pulses P+, P− produced by the control circuit 51, as exemplified in FIG. 6A; the control circuit 51 may control parameters of such a stimulus P+, P− in order to control oscillation amplitude of the response of the piezoelectric sensor 300.

For instance, the control circuit 51 may control the amount of charge injected into the piezoelectric transducer 300 by means of a programmable current pulse P+, P− having a programmable magnitude and/or pulse width.

Figure 6B:

The stimulus P+, P− provided to the piezoelectric sensor 300 may produce an electric current signal Isn, Isp which may be detected at respective input nodes SN, SP as exemplified in FIG. 6B.

The first stage 62 of the method as exemplified in FIG. 6 may further comprise:

applying transimpedance amplification (see block 624) to the response from the piezo, for instance sending a signal EN_TIA to the switches $SW_n$, $SW_p$ in order to change their status from an open state to a closed stage.

Figure 6C:
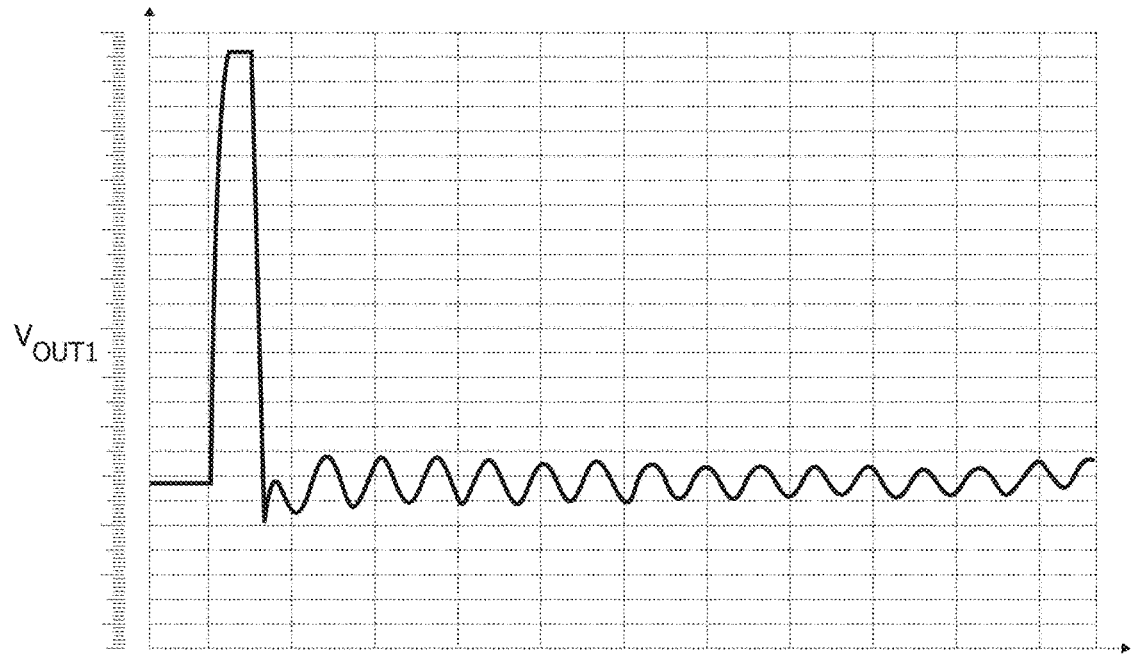

As a result, the charge of the piezoelectric sensor 300 flows through the resistance $R_f$ in the feedback branch 520c of the first amplifier stage 52 and no more through the capacitors $Cp_n$, $C_p$. Subsequently, a voltage signal $V_{OUT1}$ as exemplified in FIG. 6C may be present at the output node of the first amplifier stage 52 as a result of such an operation 624.

In one or more embodiments, varying the feedback of the first amplifier 52 may lead to several advantages. For instance, these maybe be: a reduction of time constant of the system, previously determined by capacitors CN, CP and resistors RN, RP; a reduction of the settling time of the amplifier 52, so that the amplifier 52, after entering a saturation state due to the excitation of the resonance frequency $f_r$, quickly desaturates; and a transfer function of the amplifier 52 becomes less sensitive to the low frequencies. Also, the system may be much less sensitive to any disturbances that may otherwise impact the first stage 62 of the method 60.

Figure 6D:
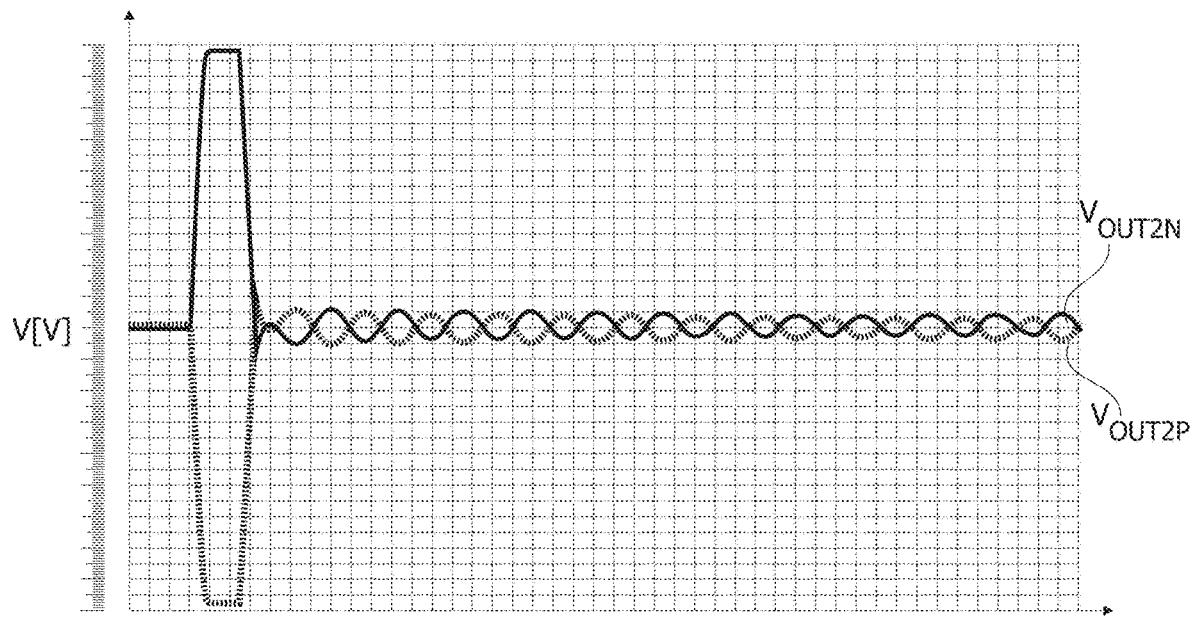
Figure 6E:
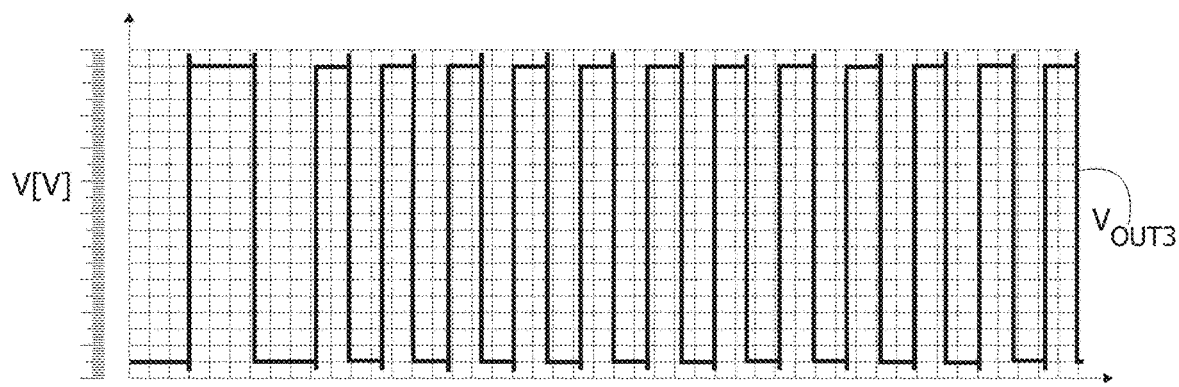

As exemplified in FIG. 6D, the signal $V_{OUT1}$ is then amplified by the second amplifier stage 54. The first stage of the method 60 exemplified by block 62 may include: digitizing, squaring the (amplified) signals $V_{OUT2N}$, $V_{OUT2P}$, resulting from the stimulated resonant oscillation to produce therefrom, via the comparator stage 56, for instance, a square wave signal $V_{OUT3}$ (as exemplified in FIG. 6E); and measuring the frequency of the square wave signal $V_{OUT3}$, for instance via a digital counter 512 included in the control logic 51, suitable to count a time interval between a pair of edges with a digital clock, which may generally have a frequency of tens of MHz.

For instance, the digital core 51 may measure the time interval by counting how many clock periods are present between two consecutive rising edges of the square signal $V_{OUT3}$.

Figure 6F:
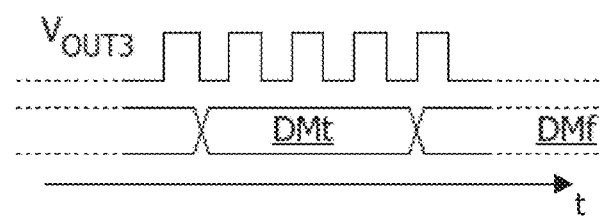

Such a counting operation may produce signals as exemplified in FIG. 6F, with the digital counter 512 producing a final count value as a result of counting time intervals between edges of the signal $V_{out}$.

Figure 8:
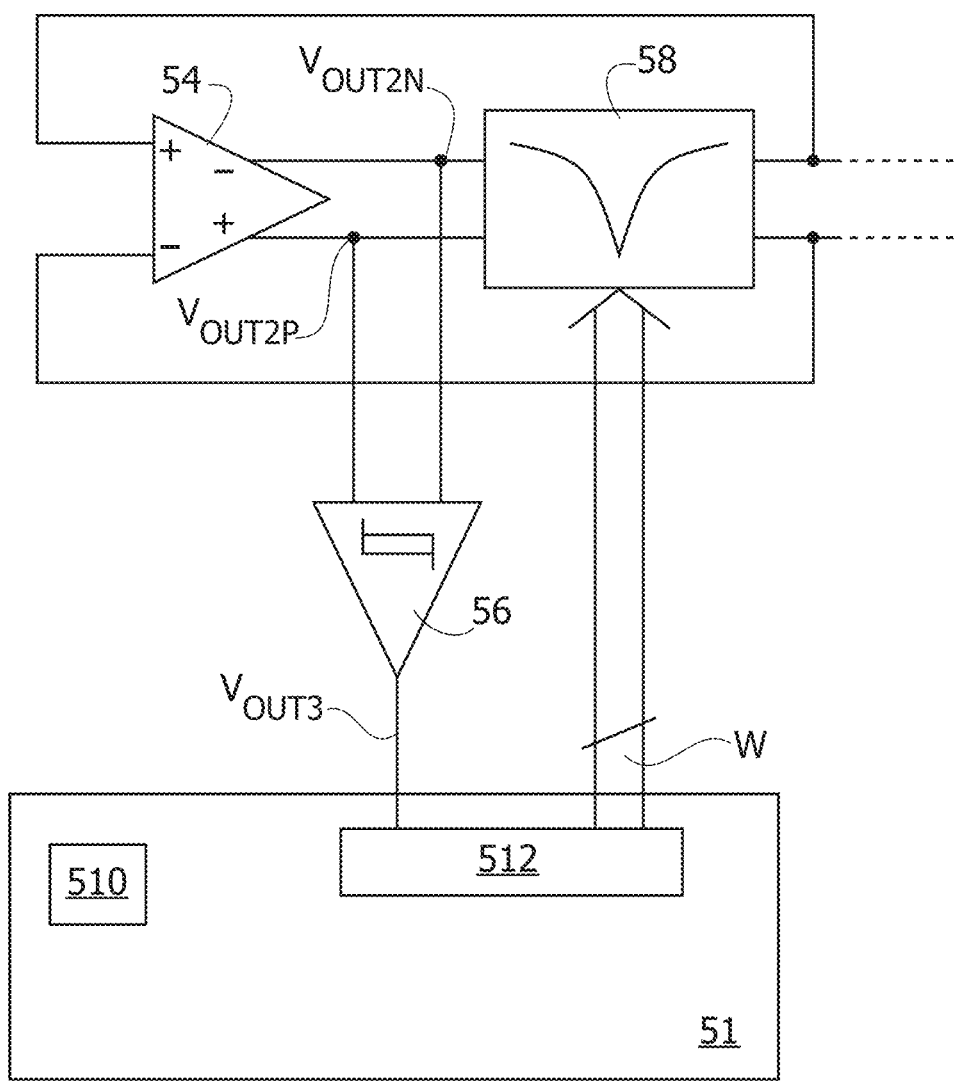
FIG. 8 is a diagram exemplary of a portion of the circuit of FIG. 5.

As exemplified in FIG. 6, the second stage 64 of the method 60 may include: setting (see block 640) the stopband frequency of the notch filter to an initial, coarse, value (e.g., a frequency value in the middle of the tunability range of the filter); this may be performed via a control word W transmitted from the control circuit 51 to the notch 58, in ways per se known; controlling (see block 642) the feedback branches 540a, 540b between output nodes of the notch filter 58 to be closed and input nodes of the second amplifier stage 54, obtaining as a result that a virtual ground condition is imposed between such input and output nodes (see, e.g., FIG. 8, representing a portion of the circuit of FIG. 5); this may induce as a result an oscillatory signal to be produced by the amplifier 54, with the oscillatory signal having a frequency equal to the stop-band frequency set for the notch filter (see block 644); detecting such an oscillatory signal having a frequency equal to that of the notch filter 58 at nodes $V_{OUT2N}$, $V_{OUT2P}$; and comparing, e.g., via the control logic block 51 the detected oscillatory signal $\Delta V$ having a frequency value dependent on the set stopband frequency value of the notch filter 58 with the resonant frequency $f_r$ measured at stage 62; and iteratively varying (see block 646) the notch word W to re-set the stopband frequency of the notch filter as a function of the result of the comparison, until the set stopband frequency matches as closely as possible the measured value of the resonant frequency $f_r$ of the sensor 300 as processed at stage 62 of the first stage 62.

For instance, iterations of operation 646 may be halted when the notch filter 58 is finely tuned to the desired frequency $f_r$, namely when the programming word W adequately matches the frequency value $f_r$ target.

For instance, a dichotomic routine (SAR routine, reverse SAR, sub-binary SAR for instance) may be suitable to perform such a matching process 646. See, for instance, the entries for "Dichotomic_search" or "Successive_approximation_ADCa" in Wikipedia® at wikipedia.org.

Figure 6G:
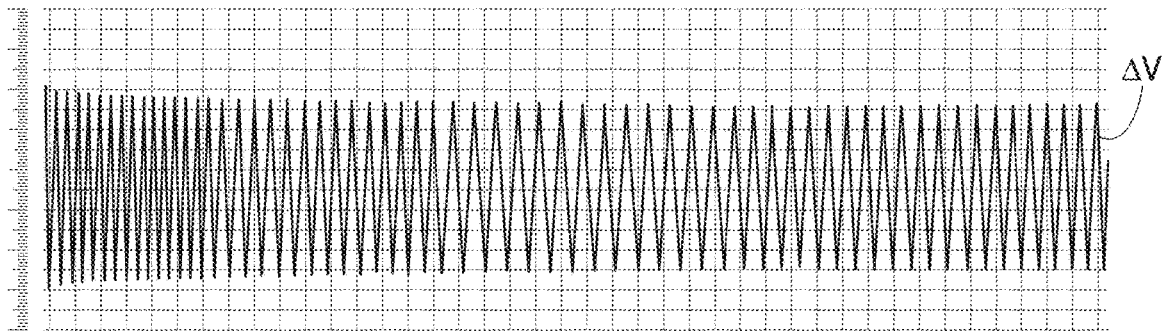

As exemplified in FIG. 6G, while the notch 58 and the second amplifier stage 54 are in the closed feedback loop 540a, 540b, an electrical signal oscillating at the notch frequency may be sensed at the output of the second amplifier stage 54, such as a voltage difference $\Delta V$, for instance $\Delta V = V_{OUT2N} - V_{OUT2P}$. Causing the notch filter to oscillate in this manner advantageously allows for an easy measurement of the resonant frequency of the notch filter. In the embodiment depicted in FIG. 5, feedback loops 540a and 540b may be closed via switches (not shown) coupled in series with each feedback loop 540a and 540b, thereby allowing for the activation and deactivation of feedback loops 540a and 540b with very little additional hardware. In some embodiments, signal path between piezoelectric sensor 300 and signal $V_{OUT1}$ may be disabled when feedback loops 540a and 540b are activated.

As exemplified in FIG. 6G, such a signal $\Delta V$ is substantially sinusoidal and that has a same frequency of the notch frequency set by the programming word W, for instance a word consisting of 9-bits.

Subsequently, the comparator 56 and the counter 512 may be used to measure frequency of the signal $\Delta V$ in a manner substantially similar to what discussed with respect to the measurement of the resonant frequency of the piezoelectric sensor 300, that is by counting the number of clock periods between a pair of edges of the signal V our 3 and obtaining a measurement of at least one period (see, e.g., the discussion with reference to FIG. 6F). The control logic 51 may then compare such a measured notch frequency and vary the programming word W, configured to set the notch frequency of the notch filter 58, until the measured notch frequency matches the resonance frequency of the piezoelectric sensor 300 measured in stage 62.

As exemplified herein, both the resonance frequency $f_r$ of the piezoelectric transducer 300 and the notch frequency of the filter 58 may be measured using substantially the same measurement arrangement involving at least one amplifier 52, 54, the comparator 56 and the logic unit 51. This may advantageously facilitate substantially compensating non-idealities involved in the measuring system and related measuring errors, so that it may be possible to use relatively simple measuring system, bringing further benefits therewith such as a reduction of design-complexity, current consumption and area footprint, for instance.

As exemplified in FIG. 6F, the comparator 56 as exemplified in FIG. 5 is used to access the digital domain where the control unit 51 (digitally) measures and processes both the resonance frequency $f_r$ of the piezoelectric sensor 300 and the stopband frequency of the notch 58. Such a measurement may be performed during a first stage DMt, reaching a final value in a second stage DMf.

Figure 7A:
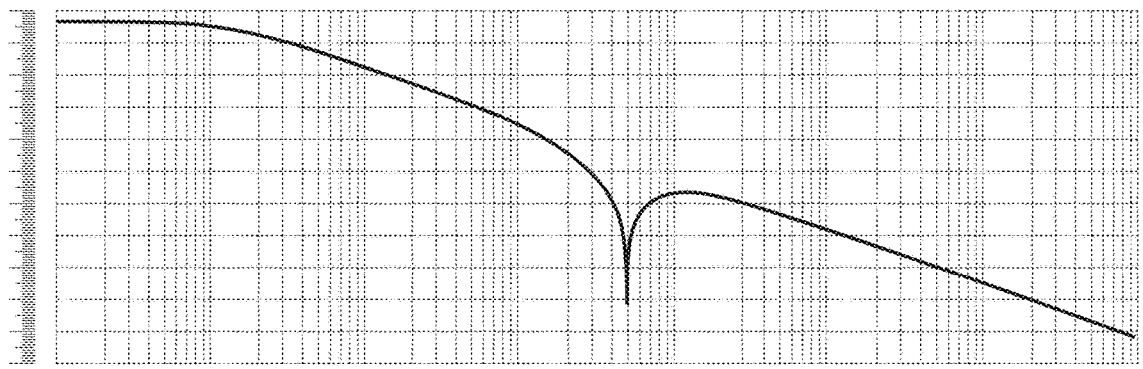
FIGS. 7A and 7B are diagrams exemplary of a response of a circuit as per the present disclosure.
Figure 7B:
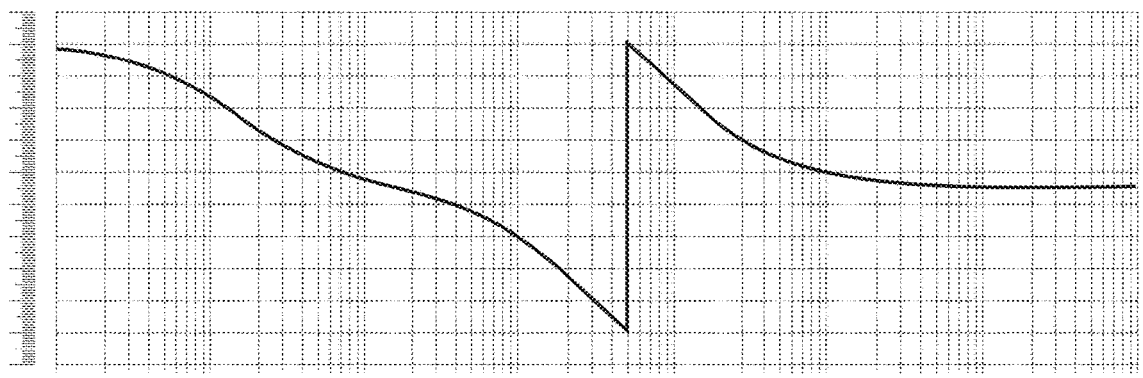

FIGS. 7A and 7B are exemplary diagrams of the circuit 50 when the feedback loop 540a, 540b is closed, in particular of the respective loop gain (FIG. 7A) and phase (FIG. 7B).

As exemplified in FIGS. 7A, 7B the circuit 50 will oscillate at the notch frequency because the phase of the loop transfer function reaches 180 degrees and the magnitude is bigger than 0 dB (in line with the so-called Barkhausen stability criterion, for instance).

A method as exemplified herein includes:
providing a piezoelectric transducer (for instance, 300) configured to transduce mechanical vibrations into transduced electrical signals at a pair of sensor electrodes (for instance, 302, 304), wherein the piezoelectric transducer has a resonance frequency (for instance, $f_r$), and coupling to the piezoelectric transducer, a notch filter (for instance, 58) configured to receive the transduced electrical signals and to produce filtered signals (for instance, RV) from the transduced electrical signals, the notch filter having a tunable stopband frequency. The method comprises: stimulating (for instance, 510, 620) resonant oscillation of the piezoelectric transducer applying to the pair of electrodes at least one pulse electrical stimulation signal (for instance, P+,P−); detecting (for instance, 52, 54, 622), at the pair of electrodes, at least one electrical signal (for instance, ISN, ISP, $V_{OUT}$, $V_{OUT2N}$, $V_{OUT2P}$) resulting from the stimulated resonant oscillation, wherein the at least one electrical signal resulting from the stimulated resonant oscillation oscillates at a resonance frequency (for instance, $f_r$) of the piezoelectric transducer; measuring (for instance, 56, 512, 624) the frequency of oscillation of the at least one electrical signal resulting from the stimulated resonant oscillation, obtaining a measurement of the resonance frequency of the piezoelectric transducer as a result; and tuning (for instance, 64, W), iteratively varying, for instance, the stopband frequency of the notch filter to match the measured resonance frequency of the piezoelectric transducer.

As exemplified herein, the tuning the stopband frequency of the notch filter to match the measured resonance frequency of the piezoelectric transducer (300) comprises: providing (for instance, 642) a feedback signal path (for instance, 54, 540a, 540b) from the output to the input of the notch filter via a gain stage (for instance, 52, 54) to produce oscillation of the gain stage, wherein the gain stage oscillates at an oscillation frequency which is a function of the stopband frequency set for the notch filter; measuring (for instance, 644) the oscillation frequency of an oscillatory output signal (for instance, ΔV) from the gain stage, obtaining a measurement of the stopband frequency of the notch filter as a result; and performing a comparison (for instance, 56) between the measured resonance frequency of the of the piezoelectric transducer and the measured stopband frequency of the notch filter, obtaining a difference therebetween as a result.

As exemplified herein, the measuring the frequency of oscillation of the at least one electrical signal resulting from the stimulated resonant oscillation and the measuring the oscillation frequency of the oscillatory output signal from the gain stage are performed at a same gain stage (for instance, 52, 54), obtaining a measurement of the resonance frequency of the piezoelectric transducer and a measurement of the stopband frequency of the notch filter as respective results.

As exemplified herein, performing the comparison comprises: producing a first square wave signal having a first frequency equal to the measured resonance frequency; producing a second square wave signal having a frequency equal to the measured stopband frequency; and checking that a pair of corresponding rising and/or falling edges in the first and second squared signals have a same time interval therebetween.

As exemplified herein, the method includes pre-setting (for instance, 512, 640) the stopband frequency of the notch filter (58) to an initial value (for instance, W) approximating the calculated resonant frequency of the piezoelectric transducer.

As exemplified herein, the method comprises iteratively re-setting (for instance, 512, 646) the stop-band frequency of the notch filter to at least one further value (for instance, W) approximating the calculated resonant frequency of the piezoelectric transducer as a function of the difference, obtained as a result of comparison (for instance, 56), between the measured oscillation frequency of the gain stage and the measured resonance frequency of the piezoelectric transducer.

As exemplified herein, the method comprises: detecting (for instance, 620) the at least one electrical signal resulting from the stimulated resonant oscillation as an electrical current signal (for instance, $I_{sn}$, $I_{sp}$); and applying transimpedance amplification (for instance, 52) to the electrical current signal and producing therefrom at least one electric voltage signal (for instance, $V_{OUT1}$).

As exemplified herein, the method comprises stimulating (for instance, 510, 620) resonant oscillation of the piezoelectric transducer applying to the pair of electrodes (for instance, 300, 302, Sn, Sp) an electrical stimulation signal (for instance, P+, P−) configured to control an amplitude of the resonant oscillation of the piezoelectric transducer.

A circuit (for instance, 50) as exemplified herein, couplable to a piezoelectric transducer (for instance, 300) configured to transduce mechanical vibrations into transduced electrical signals at a pair of sensor electrodes (for instance, 302, 304), wherein the piezoelectric transducer has a resonance frequency (for instance, $f_r$) and has coupled therewith a notch filter (for instance, 58) configured to receive the transduced electrical signals and produce filtered signals (for instance, RV) from the transduced electrical signals, the notch filter (58) having a tunable stopband frequency, comprises calibration circuitry (for instance, 51, 52, 54, 56, 58) configured to: stimulate (for instance, 51, 510) resonant oscillation of the piezoelectric transducer applying to the pair of electrodes at least one pulse electrical stimulation signal; detect (for instance, 52, 54), at the pair of electrodes, at least one electrical signal (for instance, $I_{SN}$, $I_{SP}$, $V_{OUT1}$, $V_{OUT2N}$, $V_{OUT2P}$) resulting from the stimulated resonant oscillation, wherein the at least one electrical signal resulting from the stimulated resonant oscillation oscillates at a resonance frequency (for instance, $f_r$) of the piezoelectric transducer; measure (for instance, 56, 512, 624) the frequency of oscillation of the at least one electrical signal resulting from the stimulated resonant oscillation, obtaining a measurement of the resonance frequency of the piezoelectric transducer as a result; and tune (for instance, 64, W) the stopband frequency of the notch filter to match the measured resonance frequency of the piezoelectric transducer.

As exemplified herein, the tunable notch filter comprises a digitally programmable notch filter.

As exemplified herein, the circuit comprises: a feedback signal path (for instance, 54, 540a, 540b) activatable from the output to the input of the notch filter via a gain stage (for instance, 52, 54) to produce an oscillatory output signal (for instance, $\Delta V$), wherein the oscillatory output signal from the gain stage oscillates at an oscillation frequency equal to the stopband frequency set for the notch filter; and a measuring circuit (for instance, 51) configured to measure the oscillation frequency of the gain stage, obtaining a measurement of the stopband frequency of the notch filter as a result.

As exemplified herein, the circuit comprises a frequency setting control circuit (for instance, 512) of the stopband frequency of the notch filter, the frequency setting control circuit configured to be set to an initial value (for instance, W) approximating the calculated resonant frequency of the piezoelectric transducer, wherein the frequency setting control circuit of the stopband frequency of the notch filter is configured to re-set the stop-band frequency of the notch filter to at least one further value (for instance, W) approximating the calculated resonant frequency of the piezoelectric transducer as a function of the difference between the oscillation frequency of the gain stage and the calculated resonant frequency of the piezoelectric transducer.

As exemplified herein, the calibration circuitry is further configured to detect, at the pair of electrodes, at least one electrical signal (for instance, $I_{SN}$, $I_{SP}$, $V_{OUT1}$, $V_{OUT2N}$, $V_{OUT2P}$) resulting from the stimulated resonant oscillation, via the gain stage of the feedback signal path activatable from the output to the input of the notch filter.

As exemplified herein, the circuit comprises: at least one square wave generator (for instance, 51, 510) configured to produce a first squared signal having a first frequency equal to the measured resonance frequency, and a second squared signal having a frequency equal to the measured stopband frequency; and a measuring circuit (for instance, 51, 512) configured to check that a pair of corresponding rising and/or falling edges in the first and second squared signals have a same time interval therebetween.

As exemplified herein, the circuit comprises a charge amplification stage (for instance, 520) coupled to the pair of sensor electrodes of the piezoelectric transducer, where an output of the charge amplification stage couplable (for instance, EN_TIA, Sn, Sp) to at least one electrode (for instance, 302) of the pair of sensor electrodes of the piezoelectric transducer, where the charge amplification stage is configured to apply transimpedance amplification (for instance, 52) to the electrical current signal (for instance, $I_{sn}$, $I_{sp}$) and produce therefrom at least one electric voltage signal (for instance, $V_{OUT1}$).

As exemplified herein, the calibration circuitry is configured to stimulate (for instance, 51, 510) resonant oscillation of the piezoelectric transducer applying to the pair of electrodes an electrical stimulation signal (for instance, P+, P−) configured to control an amplitude of the response of the piezoelectric sensor.

An apparatus as exemplified herein, includes: a piezoelectric transducer (for instance, 300) configured to transduce mechanical vibrations into transduced electrical signals at a pair of sensor electrodes (for instance, 302, 304), wherein the piezoelectric transducer has a resonance frequency (for instance, $f_r$) and has coupled therewith a notch filter (for instance, 58) configured to receive the transduced electrical signals and produce filtered signals (for instance, RV) from the transduced electrical signals, the notch filter having a tunable stopband frequency; and a circuit (for instance, 50) as exemplified herein, wherein the circuit comprises calibration circuitry (for instance, 51, 52, 54, 56, 58) coupled to the pair of electrodes configured to apply to the pair of electrodes the electrical stimulation signal (for instance, P+, P−) and detect at the pair of electrodes (302, 304), the at least one electrical signal (for instance, $I_{sn}$, $I_{sp}$, $V_{OUT1}$, $V_{OUT2N}$, $V_{OUT2P}$) resulting from the stimulated resonant oscillation.

One or more embodiments may present one or more of the following advantages: facilitated circuit self-tuning; reduced burden on clock precision used for measurement; increased robustness with respect to low-frequency disturbances; and robustness to process spread, and reduced testing time.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection. The extent of protection is defined by the annexed claims.

What is claimed is:

1. A method of operating a piezoelectric transducer configured to transduce mechanical vibrations into transduced electrical signals at a pair of sensor electrodes, the method comprising:

stimulating a resonant oscillation of the piezoelectric transducer by applying at least one pulse electrical stimulation signal to the pair of sensor electrodes;

detecting, at the pair of sensor electrodes, at least one electrical signal resulting from the stimulated resonant oscillation, wherein the at least one electrical signal resulting from the stimulated resonant oscillation oscillates at a resonance frequency of the piezoelectric transducer;

measuring a frequency of oscillation of the at least one electrical signal resulting from the stimulated resonant oscillation using a measurement arrangement to obtain a measured resonance frequency of the piezoelectric transducer; and tuning a stopband frequency of a notch filter coupled to the piezoelectric transducer to match the measured resonance frequency of the piezoelectric transducer, wherein tuning the stopband frequency comprises measuring the stopband frequency using the same measurement arrangement used to measure the frequency of oscillation of the at least one electrical signal.

2. The method of claim 1, wherein the tuning the stopband frequency of the notch filter to match the measured resonance frequency of the piezoelectric transducer comprises:
providing a feedback signal path from an output of the notch filter to an input of the notch filter via a gain stage to produce oscillation of the gain stage, wherein an oscillatory output signal from the gain stage oscillates at an oscillation frequency that is a function of the stopband frequency of the notch filter; and
measuring the oscillation frequency of the oscillatory output signal from the gain stage to obtain a measured stopband frequency of the notch filter; and
comparing the measured resonance frequency of the piezoelectric transducer to the measured stopband frequency of the notch filter.

3. The method of claim 2, wherein the measuring the frequency of oscillation of the at least one electrical signal resulting from the stimulated resonant oscillation and the measuring the oscillation frequency of the oscillatory output signal from the gain stage are both performed at the gain stage.

4. The method of claim 2, wherein performing the comparing comprises:
producing a first square wave signal having a first frequency equal to the measured resonance frequency;
producing a second square wave signal having a frequency equal to the measured stopband frequency; and
determining whether a pair of corresponding rising and/or falling edges in the first square wave signal and the second square wave signals have a same time interval therebetween.

5. The method of claim 2, comprising:
pre-setting the stopband frequency of the notch filter to an initial value approximating the measured resonance frequency of the piezoelectric transducer.

6. The method of claim 5, further comprising iteratively resetting the stopband frequency of the notch filter to at least one further value approximating the measured resonance frequency of the piezoelectric transducer based on the comparing.

7. The method of claim 6, wherein:
comparing the measured resonance frequency of the piezoelectric transducer to the measured stopband frequency of the notch filter comprises determining a difference between the measured resonance frequency of the piezoelectric transducer to the measured stopband frequency of the notch filter; and
iteratively resetting the stopband frequency of the notch filter further comprising determining the at least one further value based on the determined difference.

8. The method of claim 1, wherein:
detecting the at least one electrical signal resulting from the stimulated resonant oscillation comprises detecting an electrical current signal; and
the method further comprises applying transimpedance amplification to the electrical current signal and producing therefrom at least one electric voltage signal.

9. The method of claim 1, wherein the applying the at least one pulse electrical stimulation signal to the pair of sensor electrodes is configured to control an amplitude of the resonant oscillation of the piezoelectric transducer.

10. A circuit configured to be coupled to a piezoelectric transducer and to a notch filter coupled to an output of the piezoelectric transducer, wherein the piezoelectric transducer configured to transduce mechanical vibrations into transduced electrical signals at a pair of sensor electrodes, the piezoelectric transducer has a resonance frequency, the notch filter configured to receive the transduced electrical signals and produce filtered signals from the transduced electrical signals, the circuit comprising calibration circuitry configured to:
stimulate resonant oscillation of the piezoelectric transducer by applying at least one pulse electrical stimulation signal to the pair of sensor electrodes;
detect, at the pair of sensor electrodes, at least one electrical signal resulting from the stimulated resonant oscillation, wherein the at least one electrical signal resulting from the stimulated resonant oscillation oscillates at the resonance frequency of the piezoelectric transducer;
measure a frequency of oscillation of the at least one electrical signal resulting from the stimulated resonant oscillation using a measuring circuit to obtain a measured resonance frequency of the piezoelectric transducer; and
tune a stopband frequency of notch filter coupled to the piezoelectric transducer to match the measured resonance frequency of the piezoelectric transducer, wherein tuning the stopband frequency comprises measuring the stopband frequency of the notch filter using the same measuring circuit used to measure the frequency of oscillation of the at least one electrical signal.

11. The circuit of claim 10, wherein the notch filter comprises a digitally programmable notch filter.

12. The circuit of claim 10, further comprising:
a feedback signal path activatable from an output of the notch filter to an input of the notch filter via a gain stage to produce an oscillatory output signal, wherein the oscillatory output signal from the gain stage oscillates at an oscillation frequency equal to the tuned stopband frequency of the notch filter, and
the measuring circuit configured to measure the oscillation frequency of the oscillatory output signal from the gain stage to obtain the measured stopband frequency of the notch filter.

13. The circuit of claim 12, further comprising a frequency setting control circuit configured to:
set to an initial value of the stopband frequency of the notch filter approximating the measured resonance frequency of the piezoelectric transducer; and
reset the stopband frequency of the notch filter to at least one further value approximating the measured resonance frequency of the piezoelectric transducer as a function of a difference between the measured stopband frequency of the notch filter and the measured resonance frequency of the piezoelectric transducer.

14. The circuit of claim 12, wherein the calibration circuitry is further configured to detect, at the pair of sensor electrodes, at least one electrical signal resulting from the stimulated resonant oscillation, via the gain stage of the feedback signal path.

15. The circuit of claim 12, comprising:
at least one square wave generator configured to produce a first square wave signal having a first frequency equal to the measured resonance frequency of the piezoelectric transducer, and a second square wave signal having a frequency equal to the measured stopband frequency of the notch filter, wherein the measuring circuit is further configured to determine whether a pair of corresponding rising and/or falling edges in the first square wave signal and the second square wave signals have a same time interval therebetween.

16. The circuit of claim 10, further comprising a charge amplification stage coupled to the pair of sensor electrodes of the piezoelectric transducer, wherein an output of the charge amplification stage is configured to be coupled to at least one electrode of the pair of sensor electrodes of the piezoelectric transducer, and the charge amplification stage is configured to apply transimpedance amplification to an electrical current signal and produce therefrom at least one electric voltage signal.

17. The circuit of claim 10, wherein the calibration circuitry is configured to stimulate the resonant oscillation of the piezoelectric transducer by applying to the pair of sensor electrodes an electrical stimulation signal configured to control an amplitude of a response of the piezoelectric sensor.

18. An apparatus, comprising:
the circuit according to claim 10;
the piezoelectric transducer; and
the notch filter.

19. A method of using a circuit comprising an input interface configured to be coupled to a piezoelectric transducer; an amplifier having an input coupled to the input interface; a notch filter coupled to an output of the amplifier; an activatable feedback path coupled between an output of the notch filter and the input of the amplifier; and a frequency measurement circuit coupled to the output of the amplifier, the method comprising:
deactivating the feedback path and obtain a frequency measurement of a resonant frequency of the piezoelectric transducer from the frequency measurement circuit while the first feedback path is deactivated,
activating the feedback path and obtain a frequency measurement of a stopband frequency of the notch filter from the frequency measurement circuit while the first feedback path is activated, and
adjusting the stopband frequency of the notch filter to correspond to the resonant frequency of the piezoelectric transducer based on the frequency measurement of the stopband frequency of the notch filter and the frequency measurement of the resonant frequency of the piezoelectric transducer.

20. The method of claim 19, further comprising stimulating a resonant condition of the piezoelectric transducer to obtain the frequency measurement of the resonant frequency of the piezoelectric transducer by activating a signal generator coupled to the input interface.

\* \* \* \* \*

UNITED STATES PATENT AND TRADEMARK OFFICE
CERTIFICATE OF CORRECTION

PATENT NO. : 12,255,595 B2
APPLICATION NO. : 17/371368
DATED : March 18, 2025
INVENTOR(S) : Sautto et al.

It is certified that error appears in the above-identified patent and that said Letters Patent is hereby corrected as shown below:

In the Claims

In Column 14, Line 2, Claim 10:
Change "transducer configured to transduce mechanical vibrations"
To --transducer is configured to transduce mechanical vibrations--

In Column 14, Line 24, Claim 10:
Change "tune a stopband frequency of notch filter coupled to"
To --tune a stopband frequency of the notch filter coupled to--

In Column 15, Line 20, Claim 17:
Change "sensor"
To --transducer--

Signed and Sealed this
Third Day of June, 2025

Coke Morgan Stewart
*Acting Director of the United States Patent and Trademark Office*